(12) United States Patent
Hong

(10) Patent No.: US 12,689,002 B2
(45) Date of Patent: Jul. 21, 2026

(54) PLASMA PROCESSING APPARATUS, POWER SOURCE SYSTEM, AND PLASMA PROCESSING METHOD

(71) Applicant: Tokyo Electron Limited, Tokyo (JP)

(72) Inventor: Pengkai Hong, Hsin-chu City (TW)

(73) Assignee: TOKYO ELECTRON LIMITED, Tokyo (JP)

( * ) Notice: Subject to any disclaimer, the term of this patent is extended or adjusted under 35 U.S.C. 154(b) by 97 days.

(21) Appl. No.: 18/788,228

(22) Filed: Jul. 30, 2024

(65) Prior Publication Data

US 2024/0387143 A1 Nov. 21, 2024

Related U.S. Application Data

(63) Continuation of application No. PCT/JP2023/015084, filed on Apr. 13, 2023.

(30) Foreign Application Priority Data

Apr. 25, 2022 (JP) ................................. 2022-071371

(51) Int. Cl.
*H01J 37/32* (2006.01)
(52) U.S. Cl.
CPC .. *H01J 37/32174* (2013.01); *H01J 37/32091* (2013.01); *H01J 2237/3321* (2013.01)
(58) Field of Classification Search
None
See application file for complete search history.

(56) References Cited

U.S. PATENT DOCUMENTS

| | | | |
|---|---|---|---|
| 2020/0411286 A1* | 12/2020 | Koshimizu | .............. H05H 1/46 |
| 2023/0178336 A1* | 6/2023 | Rogers | .............. H01J 37/32577 |
| | | | 438/714 |
| 2023/0274913 A1* | 8/2023 | Wu | ................... H01J 37/32174 |
| | | | 327/291 |

OTHER PUBLICATIONS

International Search Report and Written Opinion mailed on Jun. 20, 2023, received for PCT Application PCT/JP2023/015084, filed on Apr. 13, 2023, 11 pages including English Translation.

* cited by examiner

*Primary Examiner* — Kenneth B Wells
(74) *Attorney, Agent, or Firm* — XSENSUS LLP

(57) ABSTRACT

A plasma processing apparatus including a plasma processing chamber, a substrate support that is provided in the plasma processing chamber and on which a substrate is placed, a gas supply for supplying a processing gas to the plasma processing chamber, an RF power source for supplying pulsed RF power to the plasma processing chamber and/or the substrate support, and forming plasma from the processing gas, and a circuitry for controlling the supply of the pulsed RF power, in which the control device controls the RF power source such that an increasing function of a power level from a supply starting point of the pulsed RF power to a peak appearing point is a downward convex function, and/or a decreasing function of a power level from a peak ending point of the pulsed RF power to a supply ending point is a downward convex function.

6 Claims, 7 Drawing Sheets

Reference Example

Reference Example

PLASMA PROCESSING APPARATUS, POWER SOURCE SYSTEM, AND PLASMA PROCESSING METHOD

CROSS-REFERENCE TO RELATED APPLICATIONS

This application is a continuation application of international application No. PCT/JP2023/015084 having an international filing date of Apr. 13, 2023, and designating the United States, the international application being based upon and claiming the benefit of priority from Japanese Patent Application No. 2022-071371, filed on Apr. 25, 2022, the entire contents of each are incorporated herein by reference.

TECHNICAL FIELD

The present disclosure relates to a plasma processing apparatus, a power source system, and a plasma processing method.

BACKGROUND

Patent Document 1 provides a method for etching an SiOC-based Low-k film or the like using an SiC film as an underlying film. In this etching method, power of an RF power source is slowly increased to a value of second power, and then a mode is set to a power modulation mode. A direct-current voltage of a variable direct-current power source is slowly increased. Damage to a wafer or a power source can be reduced by slowly increasing either the power of the RF power source or the direct-current voltage of the variable direct-current power source.

CITATION LIST

Patent Documents

Patent Document 1: JP2009-33080A

SUMMARY

The present disclosure provides a technique capable of reducing a load fluctuation of plasma.

According to an aspect of the present disclosure, a plasma processing apparatus is provided. The plasma processing apparatus includes a plasma processing chamber, a substrate support that is provided in the plasma processing chamber and on which a substrate is placed, a gas supply configured to supply a processing gas to the plasma processing chamber, an RF power source configured to supply pulsed RF power to the plasma processing chamber and/or the substrate support, and form plasma from the processing gas, and a control device configured to control the supply of the pulsed RF power, in which the control device controls the RF power source such that an increasing function of a power level from a supply starting point of the pulsed RF power to a peak appearing point is a downward convex function, and/or a decreasing function of a power level from a peak ending point of the pulsed RF power to a supply ending point is a downward convex function.

According to one aspect, a load fluctuation of plasma can be reduced.

DETAILED DESCRIPTION

Figure 1:
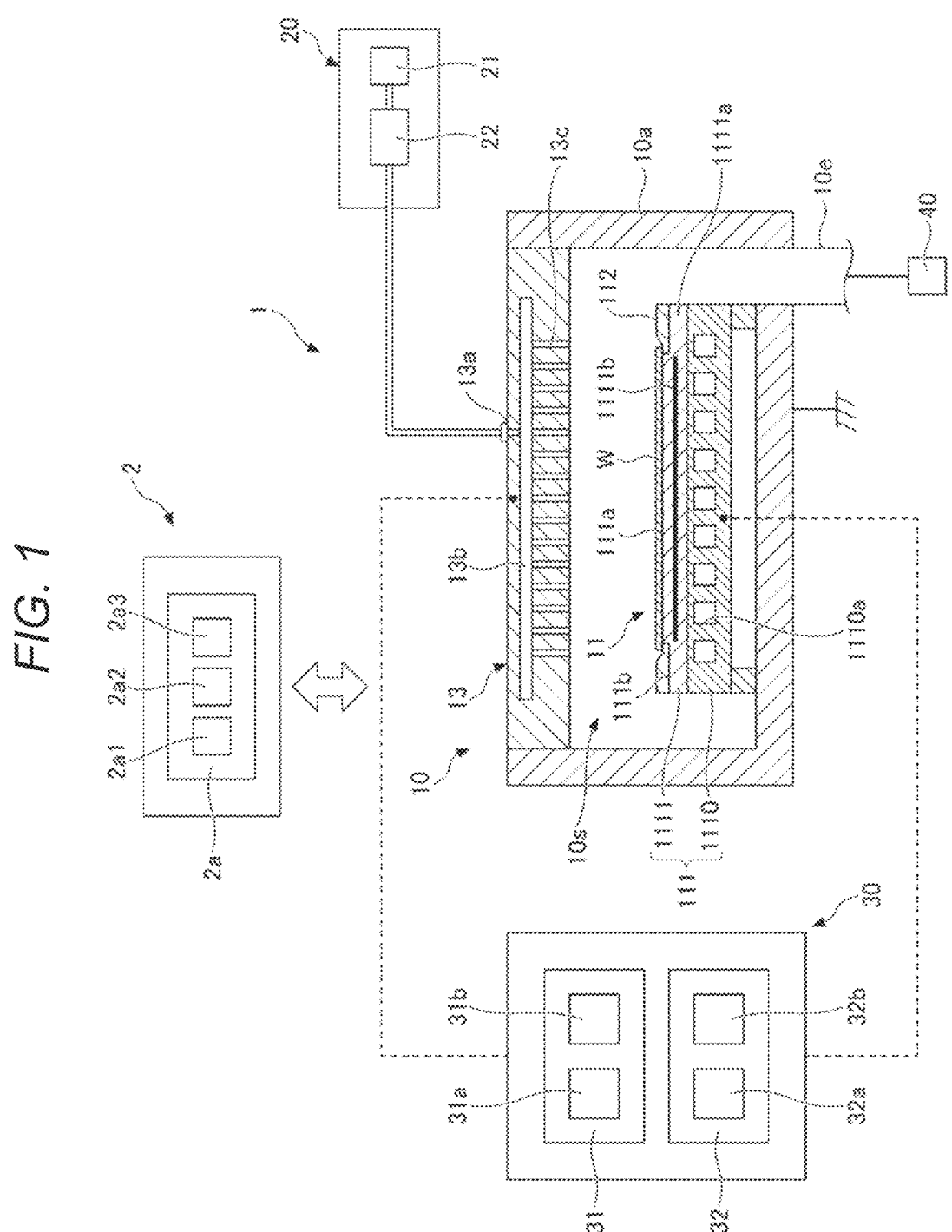
FIG. 1 is a view illustrating an example of a plasma processing apparatus according to an embodiment.

Hereinafter, embodiments for implementing the present disclosure will be described with reference to the drawings. In the respective drawings, the same components will be denoted by the same reference numerals, and overlapping descriptions thereof may be appropriately omitted.

In the present specification, deviations in directions such as parallel, right-angled, orthogonal, horizontal, perpendicular, upper and lower, and left and right are allowed to the extent that does not impair effects of the embodiments. A shape of a corner portion is not limited to a right angle, and may be rounded in an arcuate shape. Parallel, right-angled, orthogonal, horizontal, perpendicular, circular, and coincident may include substantially parallel, substantially right-angled, substantially orthogonal, substantially horizontal, substantially perpendicular, substantially circular, and substantially coincident.

Plasma Processing Apparatus

Hereinafter, a configuration example of a plasma processing apparatus will be described. FIG. 1 is a view for explaining an example of a configuration of a capacitively-coupled plasma processing apparatus.

A plasma processing apparatus 1 is a capacitively-coupled plasma processing apparatus and includes a plasma processing chamber 10, a gas supply 20, a power source 30, an exhaust system 40, and a control device 2. Further, the plasma processing apparatus 1 includes a substrate support 11 and a gas introduction unit. The gas introduction unit is configured to introduce at least one processing gas into the plasma processing chamber 10. The gas introduction unit includes a shower head 13. The substrate support 11 is disposed in the plasma processing chamber 10. The shower head 13 is disposed above the substrate support 11. In one embodiment, the shower head 13 constitutes at least a part of a ceiling of the plasma processing chamber 10. The plasma processing chamber 10 has a plasma processing space 10s defined by the shower head 13, a sidewall 10a of the plasma processing chamber 10, and the substrate support 11. The plasma processing chamber 10 has at least one gas supply port for supplying at least one processing gas into the plasma processing space 10s, and at least one gas exhaust port for exhausting the gas from the plasma processing space. The plasma processing chamber 10 is grounded. The shower head 13 and the substrate support 11 are electrically insulated from a housing of the plasma processing chamber 10.

The substrate support 11 includes a main body 111 and a ring assembly 112. The main body 111 has a central region 111a for supporting a substrate W and an annular region 111b for supporting the ring assembly 112. A wafer is an example of the substrate W. The annular region 111b of the main body 111 surrounds the central region 111a of the main body 111 in a plan view. The substrate W is disposed on the central region 111a of the main body 111 and the ring assembly 112 is disposed on the annular region 111b of the main body 111 to surround the substrate W on the central region 111a of the main body 111. Accordingly, the central region 111a is also referred to as a substrate support surface for supporting the substrate W, and the annular region 111b is also referred to as a ring support surface for supporting the ring assembly 112.

In one embodiment, the main body 111 includes a base 1110 and an electrostatic chuck 1111. The base 1110 includes a conductive member. The conductive member of the base 1110 may function as a lower electrode. The electrostatic chuck 1111 is disposed on the base 1110. The electrostatic chuck 1111 includes a ceramic member 1111a and an electrostatic electrode 1111b disposed in the ceramic member 1111a. The ceramic member 1111a has the central region 111a. In one embodiment, the ceramic member 1111a also has the annular region 111b. Other members that surround the electrostatic chuck 1111, such as an annular electrostatic chuck and an annular insulating member, may have the annular region 111b. In this case, the ring assembly 112 may be disposed on the annular electrostatic chuck or the annular insulating member, or may be disposed on both the electrostatic chuck 1111 and the annular insulating member. Further, at least one RF/DC electrode coupled to a radio frequency (RF) power source 31 and/or a direct current (DC) power source 32 to be described below may be disposed inside the ceramic member 1111a. In this case, at least one RF/DC electrode functions as the lower electrode. In a case where the bias RF signal and/or the DC signal to be described later are supplied to at least one RF/DC electrode, the RF/DC electrode is also referred to as a bias electrode. The conductive member of the base 1110 and at least one RF/DC electrode may function as a plurality of lower electrodes. Further, the electrostatic electrode 1111b may function as the lower electrode. Accordingly, the substrate support 11 includes at least one lower electrode.

The ring assembly 112 includes one or more annular members. In one embodiment, one or more annular members include one or more edge rings and at least one cover ring. The edge ring is formed of a conductive material or an insulating material, and the cover ring is formed of an insulating material.

Further, the substrate support 11 may include a temperature control module configured to adjust at least one of the electrostatic chuck 1111, the ring assembly 112, and the substrate to a target temperature. The temperature control module may include a heater, a heat transfer medium, a flow path 1110a, or a combination thereof. A heat transfer fluid, such as brine or gas, flows through the flow path 1110a. In one embodiment, the flow path 1110a is formed inside the base 1110, and one or more heaters are disposed in the ceramic member 1111a of the electrostatic chuck 1111. Further, the substrate support 11 may include a heat transfer gas supply configured to supply a heat transfer gas to a gap between a rear surface of the substrate W and the central region 111a.

The shower head 13 is configured to introduce at least one processing gas from the gas supply 20 into the plasma processing space 10s. The shower head 13 has at least one gas supply port 13a, at least one gas diffusion chamber 13b, and a plurality of gas introduction ports 13c. The processing gas supplied to the gas supply port 13a passes through the gas diffusion chamber 13b and is introduced into the plasma processing space 10s from the plurality of gas introduction ports 13c. Further, the shower head 13 includes at least one upper electrode. The gas introduction unit may include, in addition to the shower head 13, one or a plurality of side gas injectors (SGI) that are attached to one or a plurality of openings formed in the sidewall 10a.

The gas supply 20 may include at least one gas source 21 and at least one flow rate controller 22. In one embodiment, the gas supply 20 is configured to supply at least one processing gas from the respective corresponding gas sources 21 to the shower head 13 via the respective corresponding flow rate controllers 22. Each flow rate controller 22 may include, for example, a mass flow controller or a pressure-controlled flow rate controller. Further, the gas supply 20 may include one or more flow rate modulation devices that modulate or pulse flow rates of at least one processing gas.

The power source 30 includes an RF power source 31 coupled to the plasma processing chamber 10 via at least one impedance matching circuit. The RF power source 31 is configured to supply at least one RF signal (RF power) to at least one lower electrode and/or at least one upper electrode. As a result, plasma is formed from at least one processing gas supplied into the plasma processing space 10s. Accordingly, the RF power source 31 may function as at least a portion of a plasma generator configured to generate plasma from one or more processing gases in the plasma processing chamber 10. Further, supplying the bias RF signal to at least one lower electrode can generate a bias potential in the substrate W to attract an ionic component in the formed plasma to the substrate W.

In one embodiment, the RF power source 31 includes a first RF generator 31a and a second RF generator 31b. The first RF generator 31a is configured to be coupled to at least one lower electrode and/or at least one upper electrode via at least one impedance matching circuit to generate a source RF signal (source RF power) for plasma formation. In one embodiment, the source RF signal has a frequency in the range of 10 MHz to 150 MHz. In one embodiment, the first RF generator 31a may be configured to generate a plurality of source RF signals having different frequencies. The generated one or more source RF signals are supplied to at least one lower electrode and/or at least one upper electrode.

The second RF generator 31b is configured to be coupled to at least one lower electrode via at least one impedance matching circuit to generate the bias RF signal (bias RF power). A frequency of the bias RF signal may be the same as or different from a frequency of the source RF signal. In one embodiment, the bias RF signal has a lower frequency than the frequency of the source RF signal. In one embodiment, the bias RF signal has a frequency in the range of 100 kHz to 60 MHz. In one embodiment, the second RF generator 31b may be configured to generate a plurality of bias RF signals having different frequencies. The generated one or more bias RF signals are supplied to at least one lower electrode. Further, in various embodiments, at least one of the source RF signal and the bias RF signal may be pulsed.

Further, the power source 30 may include a DC power source 32 coupled to the plasma processing chamber 10. The DC power source 32 includes a first DC generator 32a and a second DC generator 32b. In one embodiment, the first DC generator 32a is configured to be connected to at least one lower electrode to generate a first DC signal. The generated first DC signal is applied to at least one lower electrode. In one embodiment, the second DC generator $32b$ is configured to be connected to at least one upper electrode to generate a second DC signal. The generated second DC signal is applied to at least one upper electrode.

In various embodiments, at least one of the first and second DC signals may be pulsed. In this case, the sequence of voltage pulses is applied to at least one lower electrode and/or at least one upper electrode. The voltage pulse may have a pulse waveform of a rectangle, a trapezoid, a triangle or a combination thereof. In one embodiment, a waveform generator for generating a sequence of voltage pulses from the DC signal is connected between the first DC generator $32a$ and at least one lower electrode. Accordingly, the first DC generator $32a$ and the waveform generator configure a voltage pulse generator. In a case where the second DC generator $32b$ and the waveform generator configure the voltage pulse generator, the voltage pulse generator is connected to at least one upper electrode. The voltage pulse may have a positive polarity or may have a negative polarity. Further, the sequence of the voltage pulses may include one or more positive voltage pulses and one or more negative voltage pulses in one cycle. The first and second DC generators $32a$ and $32b$ may be provided in addition to the RF power source $31$, and the first DC generator $32a$ may be provided instead of the second RF generator $31b$.

The exhaust system $40$ may be connected to, for example, a gas exhaust port $10e$ disposed at a bottom portion of the plasma processing chamber $10$. The exhaust system $40$ may include a pressure adjusting valve and a vacuum pump. The pressure in the plasma processing space $10s$ is adjusted by the pressure adjusting valve. The vacuum pump may include a turbo molecular pump, a dry pump, or a combination thereof.

The control device $2$ processes a computer-executable instruction for instructing the plasma processing apparatus $1$ to execute various steps to be described herein below. The control device $2$ may be configured to control respective elements of the plasma processing apparatus $1$ to execute the various steps to be described herein below. For example, the control device $2$ may control the supply of RF power when the RF power transitions from continuous waves to pulsed waves and transitions from pulsed waves to continuous waves. In an embodiment, a part or all of the control device $2$ may be included in the plasma processing apparatus $1$. The control device $2$ may include a processor $2a1$, a storage $2a2$, and a communication interface $2a3$. The control device $2$ is implemented by, for example, a computer $2a$. The processor $2a1$ may be configured to read a program from the storage $2a2$ and perform various control operations by executing the read program. The program may be stored in advance in the storage $2a2$, or may be acquired via a medium when necessary. The acquired program is stored in the storage $2a2$, and is read from the storage $2a2$ and executed by the processor $2a1$. The medium may be various storing media readable by the computer $2a$, or may be a communication line connected to the communication interface $2a3$. The processor $2a1$ may be a Central Processing Unit (CPU). The storage $2a2$ may include a random access memory (RAM), a read only memory (ROM), a hard disk drive (HDD), a solid state drive (SSD), or a combination thereof. The communication interface $2a3$ may communicate with the plasma processing apparatus $1$ via a communication line such as a local area network (LAN).

RF Power Transition Sequence

Figure 2:
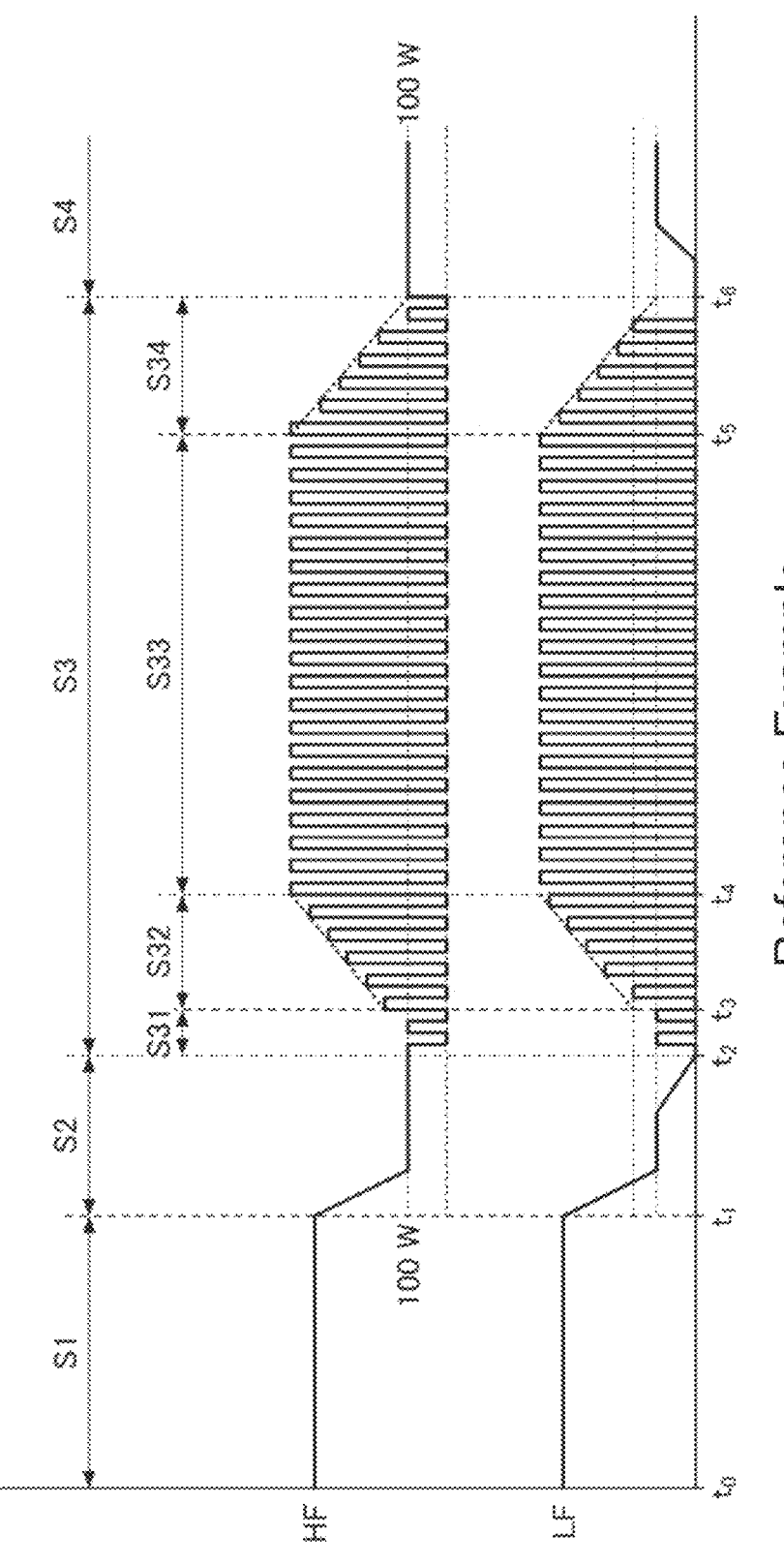
FIG. 2 is a view illustrating an example of a transition sequence of continuous waves and pulsed waves of RF power according to a reference example.
Figure 3:
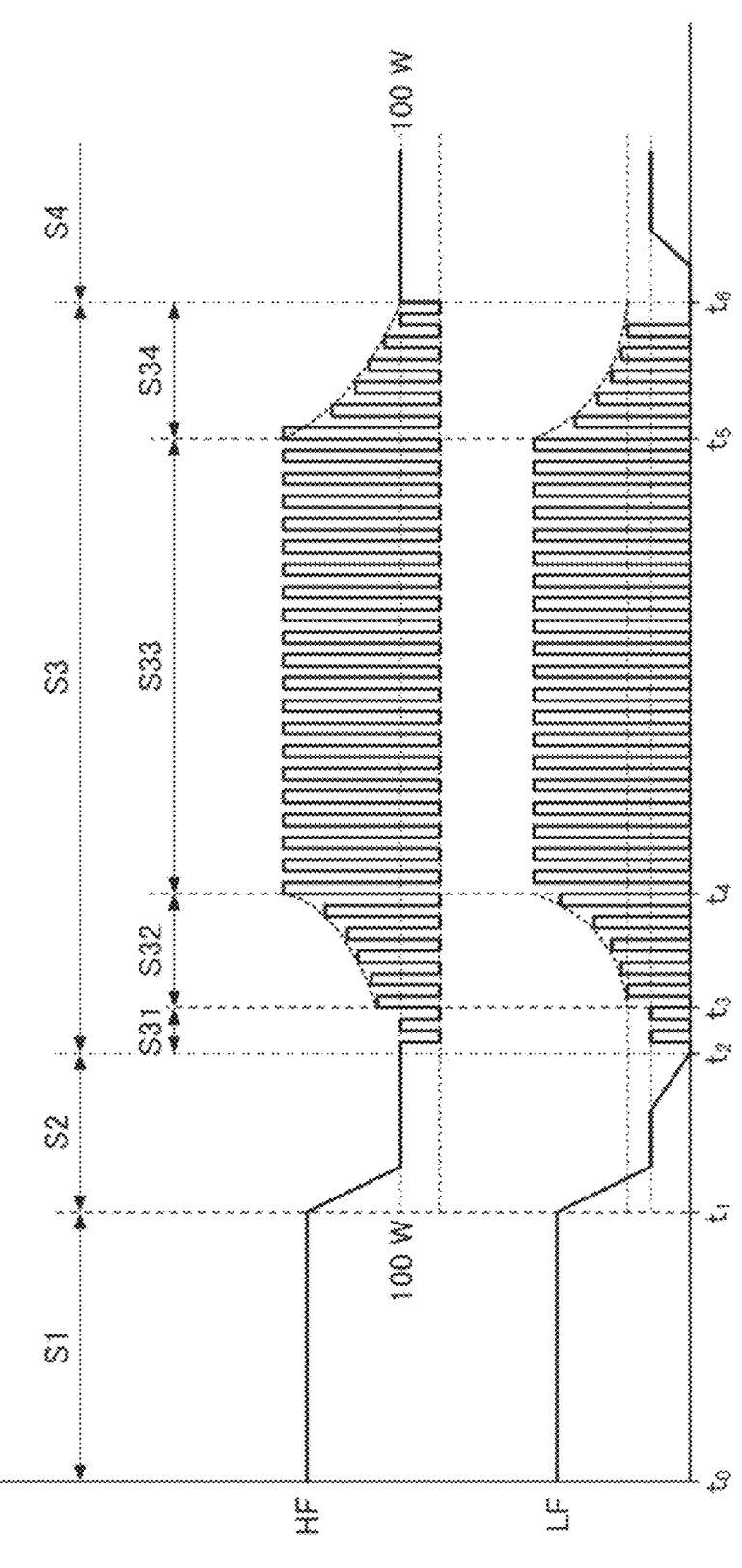
FIG. 3 is a view illustrating an example of a transition sequence of continuous waves and pulsed waves of RF power according to the embodiment.

A sequence when the RF power transitions from continuous waves to pulsed waves and when the RF power transitions from pulsed waves to continuous waves will be described with reference to FIGS. 2 and 3. FIG. 2 is a view illustrating an example of a transition sequence of continuous waves and pulsed waves of RF power according to a reference example. FIG. 3 is a view illustrating an example of a transition sequence of continuous waves and pulsed waves of RF power according to the embodiment. Although FIGS. 2 and 3 illustrate only a control condition of the RF power and do not illustrate a control condition such as a processing gas and pressure inside a chamber, plasma processing of a substrate W is performed according to a control condition set in a recipe used in substrate processing according to the present embodiment in a period from a time $t_0$ to a time $t_6$ and in a period after the time $t_6$ illustrated in FIGS. 2 and 3.

Hereinafter, pulsed waves of the RF power are also referred to as "RF pulses". RF source power of the RF power is also referred to as "HF" or "HF power", and pulsed waves of the HF are also referred to as "HF pulses". RF bias power is also referred to as "LF" or "LF power", and pulsed waves of the LF are also referred to as "LF pulses". FIGS. 2 and 3 illustrate examples of supply sequences of the HF and the LF when plasma processing is performed on a substrate, a horizontal axis represents time, and a vertical axis represents power (watts) in each drawing. Power values illustrated in FIGS. 2 and 3 are examples only, and are not limited thereto. In both FIGS. 2 and 3, in a period S1 from the time $t_0$ to a time $t_1$, both the HF and the LF are continuous waves and continuously supply power, and plasma is formed from a processing gas. In a period S2 from the time $t_1$ to a time $t_2$, both the HF and the LF supply power of continuous waves having power of a power level lower than that in the period S1, and formation of plasma continues. At the time $t_2$, both the HF and the LF transition from continuous waves to pulsed waves. In a period S3 from the time $t_2$ to a time $t_6$, both the HF and the LF supply power of pulsed waves. In the period S3, the HF pulses supply power of two levels of high and low, and the LF pulses supply power of two levels of on and off. Alternatively, the HF pulses and the LF pulses may be pulsed waves of either the power of two levels of high and low or the power of two levels of on and off.

During the period S3, in a period S31 from the time $t_2$ to a time $t_3$, power levels of both the HF pulses and the LF pulses at the time of high or on are flat (constant). In a period S32 from the time $t_3$ to a time $t_4$, power levels of the HF pulses and the LF pulses are increased. At the time $t_4$, power levels of the HF pulses and the LF pulses reach peaks (maximum). In a period S33 from the time $t_4$ to a time $t_5$, power levels of the HF pulses and the LF pulses are maintained at peak values (maximum values). In a period S34 from the time $t_5$ to the time $t_6$, power levels of the HF pulses and the LF pulses are reduced. At the time $t_6$, both the HF and the LF transition from pulsed waves to continuous waves, and in a period S4 after the time $t_6$, both the HF and the LF are continuous waves.

In both FIGS. 2 and 3, the period S32 is a period in which the HF pulses and the LF pulses are increased in synchronization, and is referred to as a "ramp up period" in the present specification. The period S34 is a period in which the HF pulses and the LF pulses are reduced in synchronization, and is referred to as a "ramp down period" in the present specification. Alternatively, starting points of the periods S32 and S34 of the HF pulses and the LF pulses may not coincide with each other (offset) without being completely synchronized with each other.

In both FIGS. 2 and 3, when transitioning from the period S2 to the period S3, that is, when the HF and the LF transition from continuous waves to pulsed waves, plasma is continuously formed (ignited) and does not disappear. Similarly, when transitioning from the period S3 to the period S4, that is, when the HF and the LF transition from pulsed waves to continuous waves, plasma is formed and does not disappear.

In both FIGS. 2 and 3, in the ramp up period S32, power levels from a supply starting point of the HF pulses and the LF pulses (a ramp up starting point, the time $t_3$) to a peak appearing point (a ramp up ending point, the time $t_4$) are increasing functions. Alternatively, when the ramp up period starts from the time $t_2$ and includes the period S31 and the period S32, power levels in the ramp up period are flat in an initial stage, and thereafter are increasing functions. When the ramp up period starts from the time $t_2$, the supply starting point (a ramp up starting point) of the HF pulses and the LF pulses is the time $t_2$. In the present embodiment, description will be continued assuming that the supply starting point (the ramp up starting point) of the HF pulses and the LF pulses is the time $t_3$.

In the ramp up period S32 in the reference example illustrated in FIG. 2, the power levels of the HF pulses and the LF pulses are increased linearly as indicated by dotted lines in S32 in FIG. 2. In contrast, in the ramp up period S32 in the embodiment illustrated in FIG. 3, the power levels of the HF pulses and the LF pulses are increased exponentially as indicated by dotted lines in S32 in FIG. 3. That is, the power levels of the HF pulses and the LF pulses are increased monotonously in the ramp up period S32 in the reference example, while the power levels of the HF pulses and the LF pulses are increased gradually in an initial stage and thereafter are increased sharply in the ramp up period S32 in the embodiment.

The same applies to the ramp down period. In the ramp down period S34 in the reference example illustrated in FIG. 2, the power levels of the HF pulses and the LF pulses are decreased linearly as indicated by dotted lines in S34 in FIG. 2. In contrast, in the ramp down period S34 in the embodiment illustrated in FIG. 3, the power levels of the HF pulses and the LF pulses are decreased exponentially as indicated by dotted lines in S34 in FIG. 3. That is, the power levels of the HF pulses and the LF pulses are decreased monotonously in the ramp down period S34 in the reference example, while the power levels of the HF pulses and the LF pulses are decreased sharply in an initial stage and thereafter are decreased gradually in the ramp down period S34 in the embodiment. The number of times the power levels of the HF pulses and the LF pulses are increased and decreased in a stepwise manner in the ramp up and in the ramp down may be, for example, 10 times, or may be other times.

RF Control in Ramp Up Period and Ramp Down Period

RF Control in Ramp Up Period

Figure 4A:
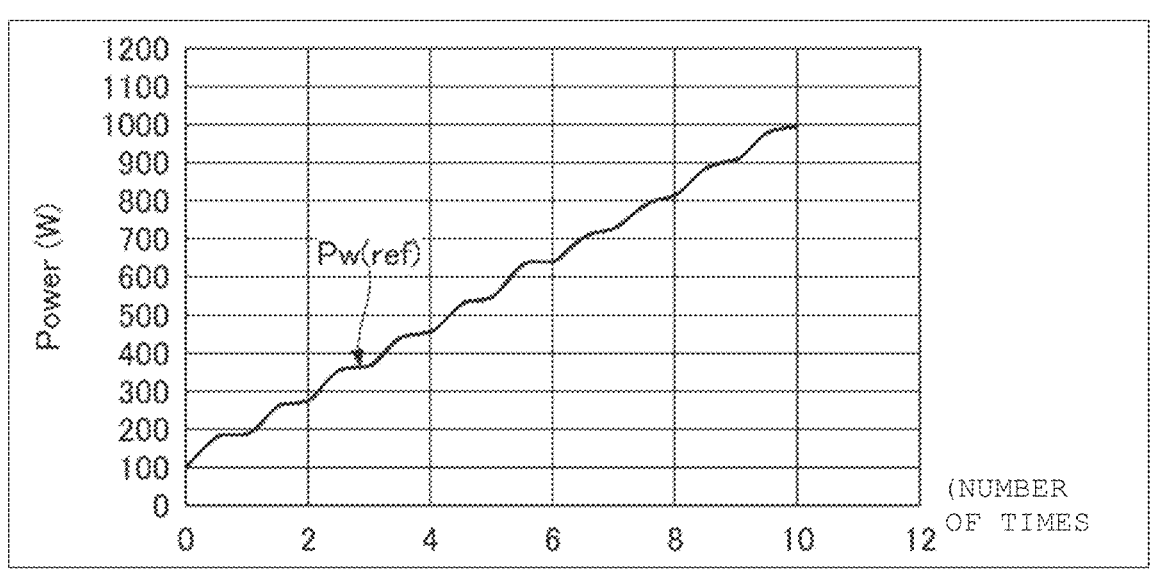
FIGS. 4A and 4B are views illustrating an increasing function of a power level of RF pulses in a ramp up period according to the reference example.
Figure 4B:
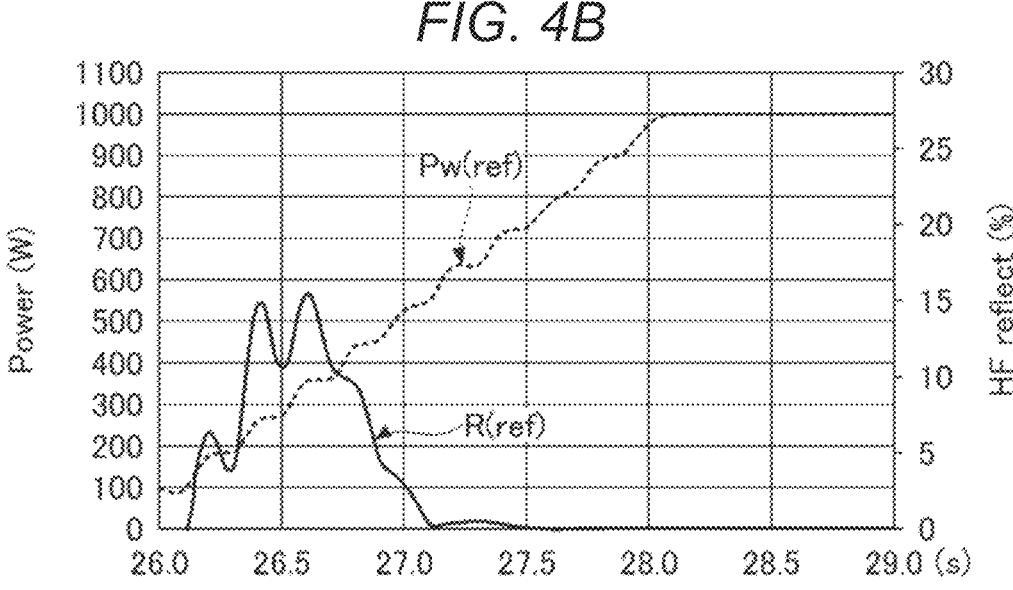
Figures 5A, 5B, 5C:
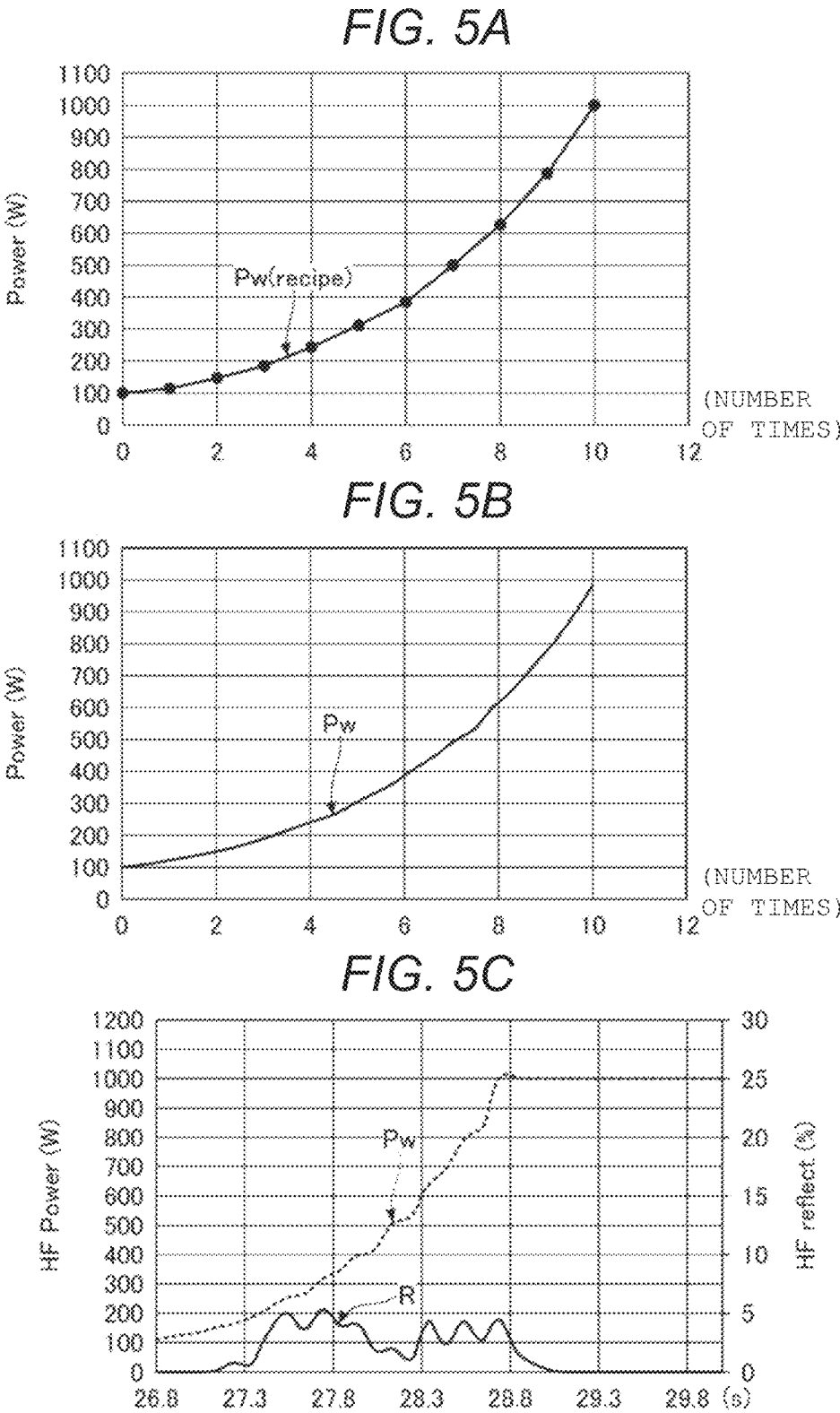
FIGS. 5A to 5C are views illustrating an increasing function of a power level of RF pulses in a ramp up period according to the embodiment.

Next, RF pulse control and experimental results of reflected waves in the ramp up period S32 and the ramp down period S34 according to the reference example illustrated in FIG. 2 and the embodiment illustrated in FIG. 3 will be described with reference to FIGS. 4A to 6C. First, the RF pulse control and the experimental results of reflected waves in the ramp up period S32 will be described. FIGS. 4A and 4B are views illustrating an example of an increasing function of a power level of the RF pulses and reflected waves in the ramp up period S32 according to the reference example. FIGS. 5A to 5C are views illustrating an example of an increasing function of a power level of the RF pulses and reflected waves in the ramp up period S32 according to the embodiment. Here, experimental results when the HF having a frequency of 40 MHz is used are illustrated.

In FIGS. 4A, 5A, and 5B, a horizontal axis represents the number of times the power level of the RF pulses (the HF pulses) is increased in a stepwise manner, and a vertical axis represents power (W). In the RF power control according to the reference example, the RF power source 31 is controlled such that the HF power is increased monotonously in the ramp up period S32, as indicated by Pw(ref) illustrated in FIG. 4A. An increasing function at this time can be expressed by Pw(ref)=cx+d. "c" is a parameter for controlling a gradient of a straight line of the HF power Pw(ref) illustrated in FIG. 4A (c>0), that is, a fluctuation speed of the power Pw(ref) in the ramp up period. "d" is a power level of the HF at a starting point of the ramp up period, that is, a power level of the HF when the horizontal axis is 0.

The number of times on the horizontal axis of FIG. 4A is the number of times that the power level of the HF is increased in a stepwise manner in a period from the supply starting point of the pulsed HF power (a starting point of the ramp up period) at the time $t_3$ illustrated in FIG. 2 to the peak appearing point (an ending point of the ramp up period) at the time $t_4$. In the example illustrated in FIG. 4A, the HF power Pw(ref) according to the reference example is controlled in a range from 100 W set at the supply starting point (the time $t_3$) to 1000 W at the peak appearing point (the time $t_4$). FIG. 4B illustrates reflected waves R(ref) which occurred as a result of the HF power Pw(ref) control according to the reference example illustrated in FIG. 4A. The horizontal axis of FIG. 4B represents time, and corresponds to the number of times on the horizontal axis of FIG. 4A. For example, "0" on the horizontal axis of FIG. 4A corresponds to "26 seconds" on the horizontal axis of FIG. 4B, and "10" on the horizontal axis of FIG. 4A corresponds to "28 seconds" on the horizontal axis of FIG. 4B. In FIG. 4B, a vertical axis (right) represents reflected waves (%) of the HF, and a vertical axis (left) represents power (power of traveling waves) (W) of the HF. The reflected waves (%) of the HF indicates a ratio of the reflected waves of the HF to the traveling waves of the supplied HF by percentage (%).

As illustrated in FIG. 4B, a percentage of the reflected waves R(ref) of the HF was as high as about 15% in an initial period (from 26 seconds to 27 seconds) of the ramp up period S32, and thereafter was substantially 0% after 27 seconds. That is, it has been found in the reference example that the reflected waves of the HF are likely to occur in the initial period of the ramp up period S32.

In contrast, in the RF power control according to the present embodiment, the RF power source 31 is controlled such that the HF power is increased following a curve set in a recipe used in the substrate processing according to the present embodiment, that is, the HF power is increased exponentially in the ramp up period S32, as indicated by Pw(recipe) illustrated in FIG. 5A.

The HF power is controlled using the Pw(recipe) illustrated in FIG. 5A as a target value, and values (not illustrated) of the HF power in the ramp up period S32 when three substrates W are actually processed were measured. HF power Pw illustrated in FIG. 5B is a graph of a function of Pw(t)=Aexp$^{(at)}$ using a coefficient a calculated by substituting the measured value into Pw(t) of functions in Formulas (1) and (2) to be described later. The coefficient "a" is a parameter for controlling a fluctuation speed of the HF power Pw in the ramp up period. "A" indicates a level of the RF power at a starting point of the ramp up period, and t indicates a time after the starting point of the ramp up period.

The number of times on the horizontal axes of FIGS. 5A and 5B is the number of times that a power level of the HF is increased in a stepwise manner in a period from the ramp up starting point at the time $t_3$ illustrated in FIG. 3 to the ramp up ending point (the peak appearing point) at the time $t_4$. In the example illustrated in FIG. 5B, the HF power Pw according to the embodiment is controlled in a range from 100 W set at the supply starting point (the time $t_3$) to 1000 W set at the peak appearing point (the time $t_4$). FIG. 5C illustrates reflected waves R which occurred as a result of the HF power Pw control according to the embodiment illustrated in FIG. 5B. A horizontal axis of FIG. 5C represents time, and corresponds to the number of times on the horizontal axis of FIG. 5B. For example, "0" on the horizontal axis of FIG. 5B corresponds to "26.8 seconds" on the horizontal axis of FIG. 5C, and "10" on the horizontal axis of FIG. 5B corresponds to "28.8 seconds" on the horizontal axis of FIG. 5C. In FIG. 5C, a vertical axis (right) represents reflected waves (%) of the HF, and a vertical axis (left) represents power (power of traveling waves) (W) of the HF. The reflected waves (%) of the HF indicates a ratio of the reflected waves of the HF to the traveling waves of the supplied HF by percentage (%).

As illustrated in FIG. 5C, a percentage of the reflected waves R of the HF power is 5% or less, and the reflected waves are reduced over the entire ramp up period S32 (from 26.8seconds to 28.8 seconds) as compared with the reference example illustrated in FIG. 4B. That is, it has been found in the embodiment that the reflected waves of the HF are less likely to occur in the ramp up period S32. In other words, many reflected waves occur in the first half of the ramp up period S32 when the HF power is small in the reference example, and few reflected waves occur over the entire ramp up period S32 in the embodiment. Accordingly, a maximum value of the reflected waves is reduced to 5% or less of the traveling waves of the HF, and a load fluctuation of plasma is reduced in the embodiment.

As described above, reflected waves can be reduced to 5% or less and a load fluctuation of plasma can be reduced by increasing the HF pulses exponentially in the ramp up period S32. Accordingly, accuracy of the substrate processing can be increased.

When the HF power is simply increased in the ramp up period S32, reflected waves are likely to occur when power is low (see FIG. 4B). This is because plasma is likely to become unstable when the HF power is low (for example, 400 W or less).

In contrast, as in the present embodiment, a fluctuation speed of the HF power can be reduced when the HF power at which plasma is likely to become unstable is low (for example, 400 W or less) by increasing the HF power exponentially in the ramp up period S32. Accordingly, when the HF power is supplied from the RF power source 31 to a side of a load (a side of an impedance matching circuit), impedance matching accuracy between the RF power source 31 and the load is increased, so that reflected waves of the HF power can be reduced and a load fluctuation of plasma can be reduced.

As described above, the HF pulses are increased exponentially as an example of the RF power in the ramp up period S32 according to the present embodiment. Alternatively, the LF power can be controlled in the same manner, and similar effects can be obtained. That is, reflected waves can be reduced and a load fluctuation of plasma can be reduced by increasing the LF pulses exponentially in the ramp up period S32.

The RF power is not limited to being increased exponentially in the ramp up period S32. For example, the RF power source 31 may be controlled such that an increasing function of a power level from the supply starting point of the RF pulses to the peak appearing point is a downward convex function. Accordingly, when the RF power at which plasma is likely to become unstable is low, a fluctuation speed of the RF power can be reduced, reflected waves of the RF power can be reduced, and a load fluctuation of plasma can be reduced. In the present specification, controlling the RF power such that the increasing function is a downward convex function refers to a matter that in a case where a horizontal axis represents time and a vertical axis represents RF power, power of the RF pulses at the time of on or high is convex downward, and the RF power is increased over time.

Specifically, the RF power source 31 is controlled such that an increasing function of a power level from the supply starting point of the RF power (for example, the time $t_3$ in FIG. 3) to the peak appearing point (for example, the time $t_4$ in FIG. 3) satisfies functions of the following formulas (1) and (2). Description will be divided into cases (i) and (ii).

(i) In a case where A (the RF power level at the supply starting point of the RF power)≠0

$$Pw(t) = A\exp^{(at)} \tag{1}$$

$$a = \ln(P_{max}/A)/t_{max} \tag{2}$$

(ii) In a case where A=0

$$Pw(t) = \exp^{(at)} - 1 \tag{1}$$

$$a = \ln(P_{max} + 1)/t_{max} \tag{2}$$

Here, t indicates a time after the supply starting point of the RF power. Pw(t) indicates the RF power level at a time t after the supply starting point. $P_{max}$ indicates a peak value (a maximum value) of the RF power level. $t_{max}$ indicates a period from the supply starting point of the RF power to the peak appearing point.

In the power control described above, the RF power source 31 may be controlled such that only the HF power in the ramp up period S32 is a downward convex function. In this case, the LF power may be increased monotonously in the ramp up period S32. Alternatively, the RF power source 31 may be controlled such that only the LF power in the ramp up period S32 is a downward convex function. In this case, the HF power may be increased monotonously in the ramp up period S32. Alternatively, the RF power source 31 may be controlled such that both the HF power and the LF power are a downward convex function in the ramp up period S32.

RF Control in Ramp Down Period

Figures 6A, 6B, 6C:
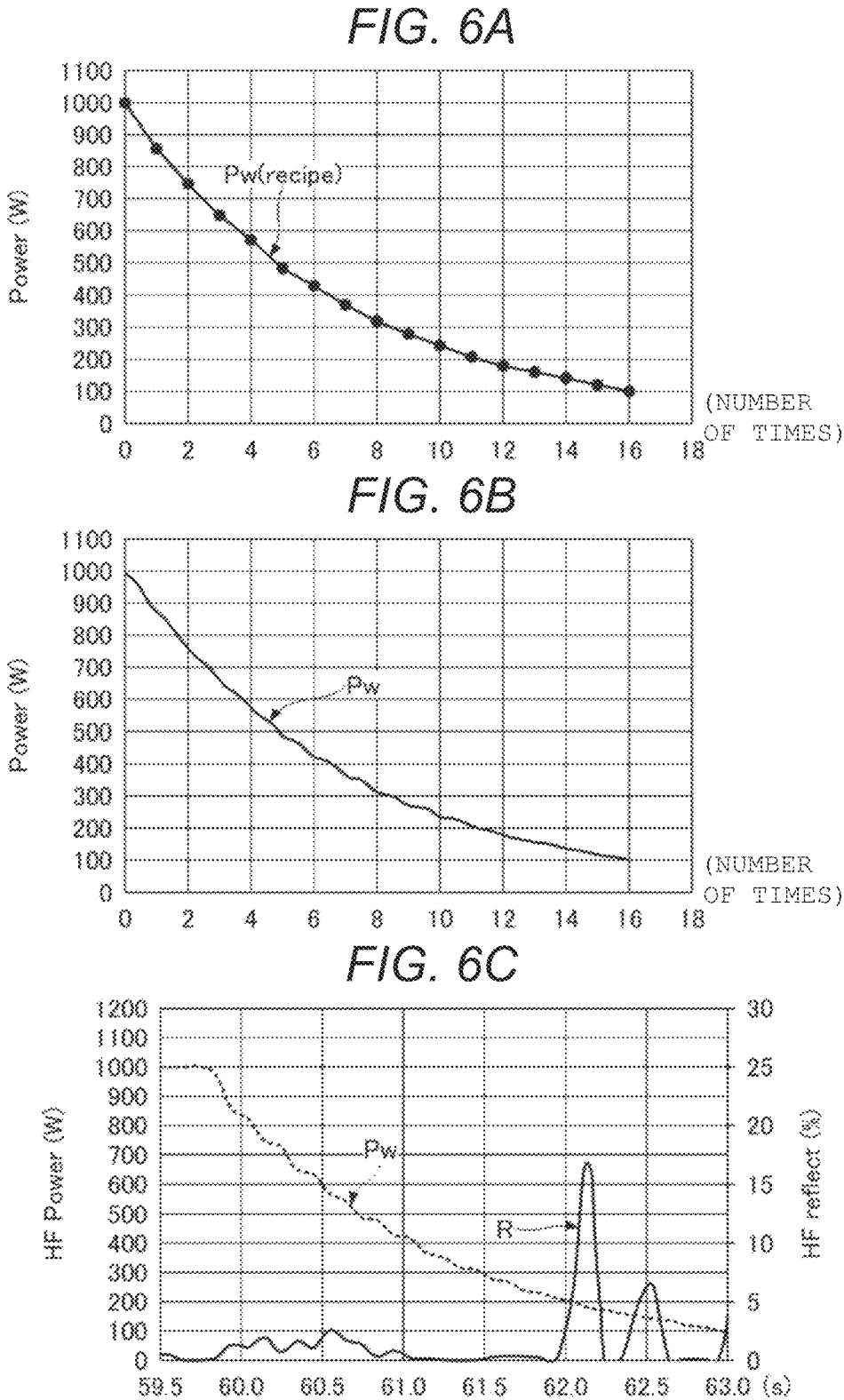
FIGS. 6A to 6C are drawings illustrating a decreasing function of a power level of RF pulses in a ramp down period according to the embodiment.

Next, the RF pulse control and experimental results of reflected waves in the ramp down period S34 will be described with reference to FIGS. 6A to 6C. FIGS. 6A to 6C are views illustrating an example of a decreasing function of a power level of the RF pulses and reflected waves in the ramp down period S34 according to the embodiment. Here, experimental results when the HF having a frequency of 40 MHz is used are illustrated.

In the RF power control according to the present embodiment, the control device 2 controls the RF power source 31 such that the HF power is decreased following a curve set in a recipe, that is, the HF power is decreased exponentially in the ramp down period S34, as indicated by Pw (recipe) illustrated in FIG. 6A.

The HF power is controlled using the Pw (recipe) illustrated in FIG. 6A as a target value, and values (not illustrated) of the HF power in the ramp down period S34 when three substrates W are actually processed were measured. HF power Pw illustrated in FIG. 6B is a graph of a function of $Pw(t)=Bexp^{(bt)}$ using a coefficient b calculated by substituting the measured value into Pw(t) of functions in Formulas (3) and (4) to be described later. The coefficient "b" is a parameter for controlling a fluctuation speed of the HF power Pw in the ramp down period. "B" indicates a level of the RF power at a starting point of the ramp down period, and t indicates a time after the starting point of the ramp down period.

The number of times on horizontal axes of FIGS. 6A and 6B is the number of times that a power level of the HF is decreased in a stepwise manner in a period from a peak ending point (a ramp down starting point) at the time $t_5$ illustrated in FIG. 3 to a supply ending point (a ramp down ending point) at the time $t_6$. In the example illustrated in FIG. 6B, the HF power Pw according to the embodiment is controlled in a range from 1000 W set at the peak ending point (the time $t_5$) to 100 W at the supply ending point (the time $t_6$). FIG. 6C illustrates reflected waves R which occurred as a result of the HF power Pw control according to the embodiment illustrated in FIG. 6B. A horizontal axis of FIG. 6C represents time, and corresponds to the number of times on the horizontal axis of FIG. 6B. In FIG. 6C, a vertical axis (right) represents reflected waves (%) of the HF, and a vertical axis (left) represents power (power of traveling waves) (W) of the HF. The reflected waves (%) of the HF indicates a ratio of the reflected waves of the HF to the traveling waves of the supplied HF by percentage (%).

As illustrated in FIG. 6C, a percentage R of the reflected waves of the HF power is 17.5% or less, and the reflected waves are few over the entire ramp down period S34. That is, it has been found in the embodiment that the reflected waves of the HF are less likely to occur in the ramp down period S34. In other words, a maximum value of the reflected waves is reduced to 17.5% or less of the traveling waves of the HF, and a load fluctuation of plasma is reduced in the ramp down period S34 in the embodiment.

As described above, reflected waves can be reduced to 17.5% or less and a load fluctuation of plasma can be reduced by decreasing the HF pulses exponentially in the ramp down period S34.

When the HF power is simply decreased in the ramp down period S34, reflected waves are likely to occur when power is low. This is because plasma is likely to become unstable when the HF power is low (for example, 400 W or less).

In contrast, as in the present embodiment, a fluctuation speed of the HF power can be reduced when the HF power at which plasma is likely to become unstable is low (for example, 400 W or less) by decreasing the HF power exponentially in the ramp down period S34. Accordingly, when the HF power is supplied from the RF power source 31 to a side of a load (a side of an impedance matching circuit), impedance matching accuracy between the RF power source 31 and the load is increased, so that reflected waves of the HF power can be reduced and a load fluctuation of plasma can be reduced.

As described above, the HF power is decreased exponentially as an example of the RF power in the ramp down period S34 according to the present embodiment. Alternatively, the LF power can be controlled in the same manner, and similar effects can be obtained. That is, reflected waves can be reduced and a load fluctuation of plasma can be reduced by decreasing the LF pulses exponentially in the ramp down period S34.

The RF power is not limited to being decreased exponentially in the ramp down period S34. For example, the RF power source 31 may be controlled such that a decreasing function of a power level from the peak ending point of the RF pulses to the supply ending point is a downward convex function. Accordingly, reflected waves of the RF power can be reduced, and a load fluctuation of plasma can be reduced. In the present specification, controlling the RF power such that the decreasing function is a downward convex function refers to a matter that in a case where a horizontal axis represents time and a vertical axis represents RF power, power of the RF pulses at the time of on or high is convex downward, and the RF power is decreased over time.

Specifically, the RF power source 31 is controlled such that the decreasing function of the power level from the peak ending point (for example, the time $t_5$ in FIG. 3) of the RF power to the supply ending point (for example, the time $t_6$ in FIG. 3) satisfies functions of the following formulas (3) and (4).

$$Pw(t) = Bexp^{(bt)} \tag{3}$$

$$b = \ln(P_{min}/B)/t_{max} \tag{4}$$

B indicates the RF power level at the peak ending point of the RF power. t indicates a time after the peak ending point of the RF power. Pw(t) indicates the RF power level at a time t after the peak ending point. $P_{min}$ indicates a minimum value of the RF power level. $t_{max}$ indicates a period from the peak ending point of the RF power to the supply ending point.

In the power control described above, the RF power source 31 may be controlled such that only the HF power in the ramp down period S34 is a downward convex function. In this case, the LF power may be decreased monotonously in the ramp down period S34. Alternatively, the RF power source 31 may be controlled such that only the LF power in the ramp down period S34 is a downward convex function. In this case, the HF power may be decreased monotonously in the ramp down period S34. Alternatively, the RF power source 31 may be controlled such that both the HF power and the LF power are a downward convex function in the ramp down period S34.

Modification 1

As another example in which the increasing function of the power level from the supply starting point of the pulsed RF power to the peak appearing point is a downward convex function, a gradient of a convex function may be changed in an intermediate portion. For example, the increasing function of the power level may be indicated by a straight line having a gentle gradient (a gradient a1) from the supply starting point (for example, the time $t_3$ in FIG. 3) of the RF power to a time (a time tt) in an intermediate portion up to the peak appearing point (for example the time $t_4$ in FIG. 3). The increasing function the power level may be indicated by a straight line having a gradient a2 different from the gradient al from the time tt to the peak appearing point (for example, the time $t_4$ in FIG. 3), thereby the gradient may be changed. In this case, the gradient al is set to a value smaller than the gradient a2, and the increasing function of the power level is a downward convex function. In this manner, reflected waves of the RF power can be reduced and a load fluctuation of plasma in the ramp up period can be reduced by controlling the gradient to be gentle in a period from the supply starting point of the RF power to a predetermined time (the time tt) and controlling the power level so that the increasing function is a downward convex function. Although a straight line from the supply starting point of the RF power to the peak appearing point is described using a combination of straight lines whose gradients are changed at the time tt, the present disclosure is not limited thereto. The increasing function of the present disclosure is not limited to a straight line, and a combination of a straight line and/or a curve may be used as long as the gradient can be controlled to be gentle for a while after the start of the supply of the RF power and the power level can be controlled so that the increasing function is a downward convex function.

Modification 2

As another example in which the decreasing function of the power level from the peak ending point (the ramp down starting point) of the pulsed RF power to the supply ending point (the ramp down ending point) is a downward convex function, a gradient of a convex function may be changed in an intermediate portion. For example, the decreasing function of the power level may be indicated by a straight line having a gradient a3 from the peak ending point (for example, the time $t_5$ in FIG. 3) of the RF power to a time (a time tk) in an intermediate portion up to the supply ending point (for example, the time $t_6$ in FIG. 3). The decreasing function of the power level may be indicated by a straight line having a gradient a4 different from the gradient a3 from the time tk to the supply ending point (for example, the time $t_6$ in FIG. 3), thereby the gradient may be changed. In this case, the gradient a4 is set to a value smaller than the gradient a3, and the decreasing function of the power level is a downward convex function. In this manner, reflected waves of the RF power can be reduced and a load fluctuation of plasma in the ramp down period can be reduced by controlling the gradient to be gentle in a period from the supply ending point of the RF power to a predetermined time (the time tk) and controlling the power level so that the decreasing function is a downward convex function. Although a straight line from the peak ending point of the RF power to the supply ending point is described using a combination of straight lines whose gradients are changed at the time tk, the present disclosure is not limited thereto. The decreasing function of the present disclosure is not limited to a straight line, and a combination of a straight line and/or a curve may be used as long as the gradient can be controlled to be gentle for a while before the ending of the supply of the RF power and the power level can be controlled so that the decreasing function is a downward convex function.

As described above, according to the plasma processing apparatus and the plasma processing method of the present embodiment, a load fluctuation of plasma can be reduced.

Plasma Processing Method

Figure 7:
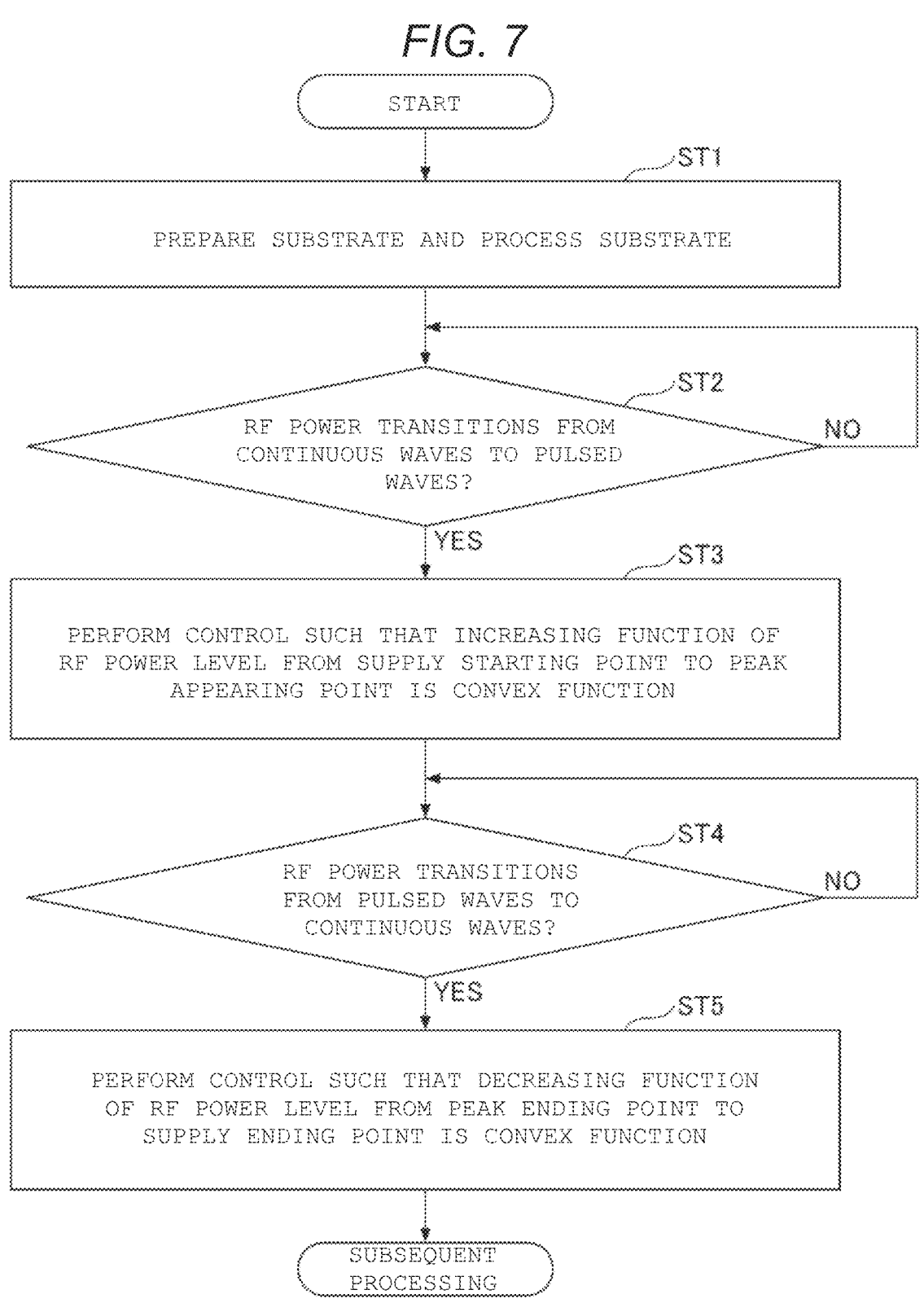
FIG. 7 is a flowchart illustrating an example of a plasma processing method according to the embodiment.

Next, the plasma processing method performed by a power source system used in the plasma processing apparatus 1 according to the present embodiment will be described with reference to FIG. 7. FIG. 7 is a flowchart illustrating an example of the plasma processing method according to the embodiment.

The power source system includes the RF power source 31 that supplies pulsed RF power to the plasma processing chamber 10 and/or the substrate support 11, and the control device 2 that controls the supply of the pulsed RF power. RF power to be described below may be HF power, LF power, or both HF power and LF power.

In the processing, first, in step ST1, the control device 2 performs control to prepare a substrate on the substrate support 11, supply a processing gas from the gas supply 20 into the plasma processing chamber 10, and supply RF power of continuous waves from the RF power source 31. In this manner, the processing gas is formed into plasma, and the substrate is subjected to plasma processing.

In step ST2, the control device 2 determines whether the RF power transitions from continuous waves to pulsed waves. When it is determined that the RF power does not transition from continuous waves to pulsed waves (NO in step ST2), the control device 2 repeats the determination processing in step ST2 until it is determined that the RF power transitions from continuous waves to pulsed waves in step ST2 (YES in step ST2).

When it is determined that the RF power transitions from continuous waves to pulsed waves, the control device 2 proceeds the processing to step ST3, controls the RF power source 31 such that the increasing function of the RF power from the supply starting point of the RF pulses to the peak appearing point is a downward convex function, and proceeds the processing to step ST4.

In step ST4, the control device 2 determines whether the RF power transitions from pulsed waves to continuous waves. When it is determined that the RF power does not transition from pulsed waves to continuous waves (NO in step ST4), the control device 2 repeats the determination processing in step ST4 until it is determined that the RF power transitions from pulsed waves to continuous waves in step ST4 (YES in step ST4).

When it is determined that the RF power transitions from pulsed waves to continuous waves, the control device 2 proceeds the processing to step ST5, controls the RF power source 31 such that the decreasing function of the RF power level from the peak ending point of the RF pulses to the supply ending point is a downward convex function, and proceeds the processing to subsequent processing.

According to the plasma processing method performed by the power source system of the present disclosure, reflected waves of the RF power can be reduced, and a load fluctuation of plasma in the ramp up period and/or the ramp down period can be reduced.

The plasma processing apparatus, the power source system, and the plasma processing method of the embodiment disclosed herein are illustrative and should not be construed as being limited in all aspects. Various modifications and improvements can be made to the embodiments without departing from the spirit and scope of the appended claims. The aspects disclosed in the above embodiments also can have the other configurations to the extent not in conflict, and can be combined with each other to the extent not in conflict.

The plasma processing apparatus according to the present disclosure can be applied to an atomic layer deposition (ALD) apparatus or an apparatus of any type including capacitively coupled plasma (CCP), inductively coupled plasma (ICP), radial line slot antenna (RLSA), electron cyclotron resonance plasma (ECR), and helicon wave plasma (HWP).

The invention claimed is:

1. A plasma processing apparatus comprising:

a plasma processing chamber, a substrate support provided in the plasma processing chamber and configured to receive a substrate, a gas supply configured to supply a processing gas to the plasma processing chamber, an RF power source configured to:

supply pulsed RF power to the plasma processing chamber and/or the substrate support, and form plasma from the processing gas, and circuitry configured to control the supply of the pulsed RF power by controlling the RF power source such that an increasing function of a power level from a supply starting point of the pulsed RF power to a peak appearing point is an upward concave function, and/or a decreasing function of the power level from a peak ending point of the pulsed RF power to a supply ending point is an upward concave function, wherein the circuitry controls the RF power source such that the increasing function of the power level from the supply starting point of the RF power to the peak appearing point satisfies functions in the following formulas (1) and (2), in which a level of the RF power at the supply starting point of the RF power is defined as A, in a case where A≠0, $$Pw(t) = A\exp^{(at)} \tag{1}$$

$$a = \ln(P_{max}/A)/t_{max} \tag{2}$$

in a case where A=0, $$Pw(t) = \exp^{(at)} - 1 \tag{1}$$

$$a = \ln(P_{max} + 1)/t_{max} \tag{2}$$

t indicates a time after the supply starting point of the RF power, Pw(t) indicates a level of the RF power at the time t after the supply starting point, Pmax indicates a peak value (a maximum value) of the level of the RF power, and tmax indicates a period from the supply starting point of the RF power to the peak appearing point, or wherein the circuitry controls the RF power source such that the decreasing function of the power level from the peak ending point of the RF power to the supply ending point satisfies functions in the following formulas (3) and (4), in which a level of the RF power at the peak ending point of the RF power is defined as B, $$Pw(t) = B\exp^{(bt)} \tag{3}$$

$$b = \ln(P_{min}/B)/t_{max} \tag{4}$$

t indicates a time after the peak ending point of the RF power, Pw(t) indicates a level of the RF power at the time t after the peak ending point, $P_{min}$ indicates a minimum value of the level of the RF power, and $t_{max}$ indicates a period from the peak ending point to the supply ending point.

2. The plasma processing apparatus according to claim 1, wherein the RF power is source RF power supplied to the plasma processing chamber or to the substrate support, and/or the RF power is bias RF power supplied to the substrate support.

3. A power source system used in a plasma processing apparatus including a plasma processing chamber and a substrate support, the power source system comprising:

an RF power source configured to:

supply pulsed RF power to the plasma processing chamber and/or the substrate support, and form plasma from a processing gas, and circuitry configured to control the supply of the pulsed RF power by controlling the RF power source such that an increasing function of a power level from a supply starting point of the pulsed RF power to a peak appearing point is an upward concave function, and/or the decreasing function of a power level from a peak ending point of the pulsed RF power to a supply ending point is an upward concave function, wherein the circuitry controls the RF power source such that the increasing function of the power level from the supply starting point of the RF power to the peak appearing point satisfies functions in the following formulas (1) and (2), in which a level of the RF power at the supply starting point of the RF power is defined as A, in a case where A≠0, $$Pw(t) = A\exp^{(at)} \tag{1}$$

$$a = \ln(P_{max}/A)/t_{max} \tag{2}$$

in a case where A=0, $$Pw(t) = \exp^{(at)} - 1 \tag{1}$$

$$a = \ln(P_{max} + 1)/t_{max} \tag{2}$$

t indicates a time after the supply starting point of the RF power, Pw(t) indicates a level of the RF power at the time t after the supply starting point, Pmax indicates a peak value (a maximum value) of the level of the RF power, and $t_{max}$ indicates a period from the supply starting point of the RF power to the peak appearing point, or wherein the circuitry controls the RF power source such that the decreasing function of the power level from the peak ending point of the RF power to the supply ending point satisfies functions in the following formulas (3) and (4), in which a level of the RF power at the peak ending point of the RF power is defined as B, $$Pw(t) = B\exp^{(bt)} \tag{3}$$

$$b = \ln(P_{max}/B)/t_{max} \tag{4}$$

t indicates a time after the peak ending point of the RF power, Pw(t) indicates a level of the RF power at the time t after the peak ending point, $P_{min}$ indicates a minimum value of the level of the RF power, and $t_{max}$ indicates a period from the peak ending point to the supply ending point.

4. The power source system according to claim 3, wherein the RF power is source RF power supplied to the plasma processing chamber or to the substrate support, and/or the RF power is bias RF power supplied to the substrate support.

5. A plasma processing method performed by a plasma processing apparatus, the plasma processing apparatus including:

a plasma processing chamber, a substrate support provided in the plasma processing chamber, the substrate support configured to receive a substrate, a gas supply configured to supply a processing gas to the plasma processing chamber, and an RF power source configured to:

supply pulsed RF power to the plasma processing chamber and/or the substrate support, and form plasma from the processing gas, the plasma processing method comprising:

preparing the substrate on the substrate support and processing the substrate using the plasma formed from the processing gas, and controlling the RF power source such that an increasing function of a power level from a supply starting point of the pulsed RF power to a peak appearing point is an upward concave function, and/or a decreasing function of the power level from a peak ending point of the pulsed RF power to a supply ending point is an upward concave function, wherein the RF power source is controlled such that the increasing function of the power level from the supply starting point of the RF power to the peak appearing point satisfies functions in the following formulas (1) and (2), in which a level of the RF power at the supply starting point of the RF power is defined as A, in a case where A≠0, $$Pw(t) = A\exp^{(at)} \tag{1}$$

$$a = \ln(P_{max}/A)/t_{max} \tag{2}$$

in a case where A=0, $$Pw(t) = \exp^{(at)} - 1 \tag{1}$$

$$a = \ln(P_{max} + 1)/t_{max} \tag{2}$$

t indicates a time after the supply starting point of the RF power, Pw(t) indicates a level of the RF power at the time t after the supply starting point, $P_{max}$ indicates a peak value (a maximum value) of the level of the RF power, and $t_{max}$ indicates a period from the supply starting point of the RF power to the peak appearing point, or wherein the RF power source is controlled such that the decreasing function of the power level from the peak ending point of the RF power to the supply ending point satisfies functions in the following formulas (3) and (4), in which a level of the RF power at the peak ending point of the RF power is defined as B, $$Pw(t) = B\exp^{(bt)} \tag{3}$$

$$b = \ln(P_{max}/B)/t_{max} \tag{4}$$

t indicates a time after the peak ending point of the RF power, Pw(t) indicates a level of the RF power at the time t after the peak ending point, $P_{min}$ indicates a minimum value of the level of the RF power, and $t_{max}$ indicates a period from the peak ending point to the supply ending point.

6. The plasma processing method according to claim 5, wherein the RF power is source RF power supplied to the plasma processing chamber or to the substrate support, and/or the RF power is bias RF power supplied to the substrate support.

* * * * *